United States Patent [19]
Andresen et al.

[11] Patent Number: 5,305,184
[45] Date of Patent: Apr. 19, 1994

[54] METHOD AND APPARATUS FOR IMMERSION COOLING OR AN ELECTRONIC BOARD

[75] Inventors: Rolf Andresen; Robert J. Bellar; Sung J. Kim; Alan L. Murphy, all of Tucson, Ariz.

[73] Assignee: IBM Corporation, Armonk, N.Y.

[21] Appl. No.: 992,287

[22] Filed: Dec. 16, 1992

[51] Int. Cl.⁵ .................................... H05K 7/20
[52] U.S. Cl. .................... 361/699; 62/259.2; 165/104.33; 257/714; 361/720
[58] Field of Search ............ 361/382, 385, 395, 689, 361/699, 701, 702, 704, 720, 736, 752; 174/252; 62/259.2, 418; 165/80.4, 80.5, 104.33; 257/713, 714

[56] References Cited

U.S. PATENT DOCUMENTS

| | | | |
|---|---|---|---|
| 3,741,292 | 6/1973 | Aakalu et al. | 165/105 |
| 3,999,105 | 12/1976 | Archey et al. | 317/100 |
| 4,313,492 | 2/1982 | Andros et al. | 165/104.26 |
| 4,323,914 | 4/1982 | Berndlmaier et al. | 357/82 |
| 4,449,580 | 5/1984 | Reisman et al. | 165/104.34 |
| 4,727,454 | 2/1988 | Neidig et al. | 361/382 |
| 4,805,691 | 2/1989 | Cook et al. | 165/104.38 |
| 4,808,457 | 2/1989 | Kruck | 428/69 |
| 4,847,731 | 7/1989 | Smolley | 361/385 |
| 4,888,663 | 12/1989 | Longerich et al. | 361/385 |
| 4,949,164 | 8/1990 | Obashi et al. | 357/82 |
| 4,959,111 | 9/1990 | Kruck | 156/145 |
| 5,057,909 | 10/1991 | Mok et al. | 357/81 |

OTHER PUBLICATIONS

D. De May et al., "Cooling of Hybrid Circuits With Fluorocarbon Liquids", in *Hybrid Circuits*, No. 19, pp. 76–77 (May 1989).

*Primary Examiner*—Gerald P. Tolin
*Attorney, Agent, or Firm*—Benman & Collins

[57] ABSTRACT

A liquid heat sink is provided that employs natural convection of a liquid coolant (18') to cool a printed circuit board (14) on which are mounted a plurality of heat-generating components (12). In particular, the spacing d between the heat-generating components and a cold plate (20) used to cool the liquid must be such as to provide a Rayleigh number of at least about 1700 in the Rayleigh equation:

$$Ra = \frac{g\beta(T_2 - T_1)d^3}{\nu\alpha},$$

In the above equation, g is the acceleration of gravity, $\beta$ is the volumetric coefficient of expansion of the liquid coolant, $T_1$ is the temperature of the cold plate, $T_2$ is the temperature of the component to be cooled, $\nu$ is the kinematic viscosity of the liquid coolant, and $\alpha$ is the thermal diffusivity of the liquid coolant. The novel heat sink of the present invention allows complete immersion of the component in the liquid to provide maximum heat transfer, while at the same time providing a mounting/packaging scheme that allows full utilization of the desired heat transfer properties.

7 Claims, 3 Drawing Sheets

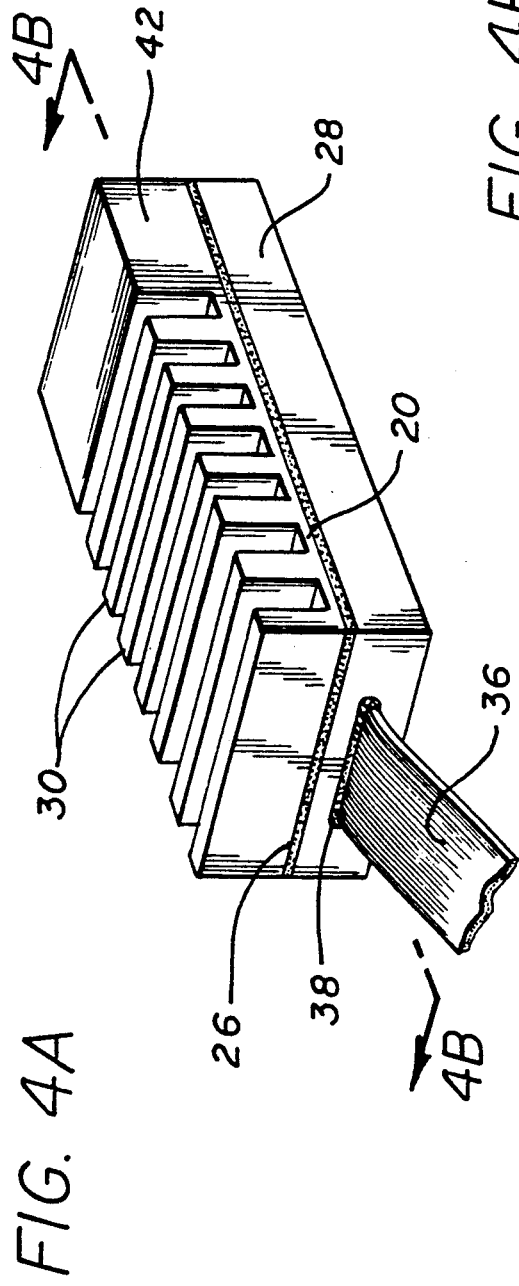
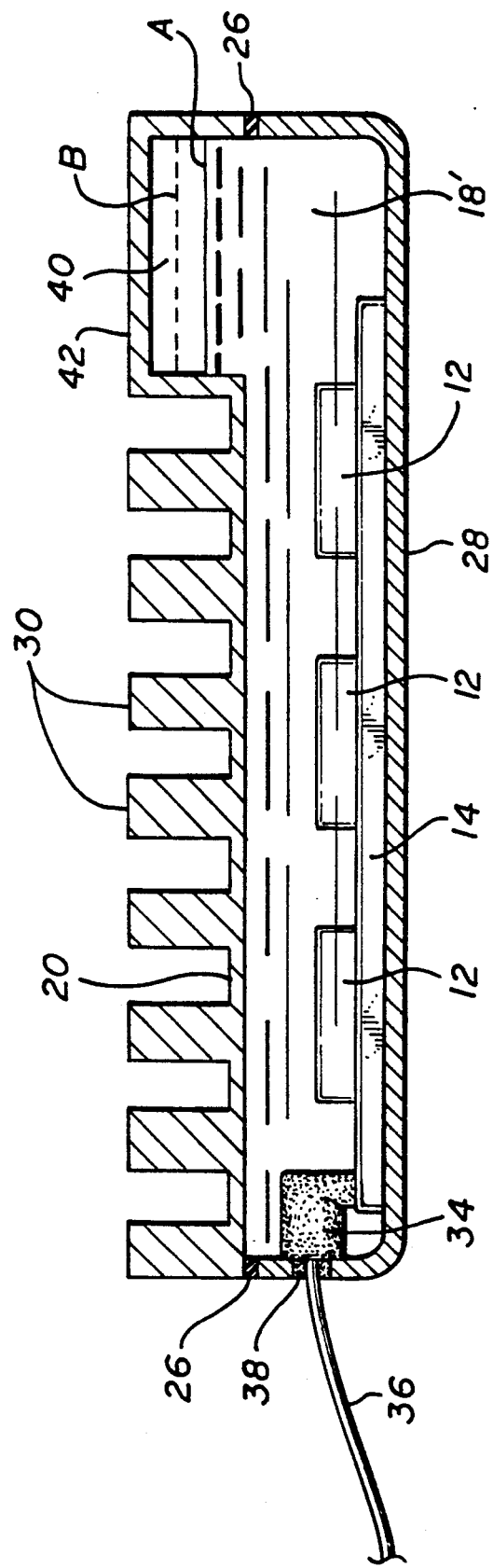

METHOD AND APPARATUS FOR IMMERSION COOLING OR AN ELECTRONIC BOARD

BACKGROUND OF THE INVENTION

1. Field of the Invention

The present invention relates generally to heat sinks used to cool electronic modules, and, more particularly, to liquid heat sinks used to cool such modules.

2. Description of the Related Art

When the surface heat flux from a module exceeds a critical value, a heat sink is required to increase the surface area for heat transfer. This can be done by the use of either a conventional solid heat sink, such as an aluminum heat sink, or a liquid heat sink. When more than one module requires a heat sink and space restricts the use of conventional aluminum heat sinks, a liquid heat sink can be used to transfer heat from hot components to a cold plate.

Conventional liquid heat sinks are enveloped to contain the liquid, and this envelope produces the following restrictions:

1) A pressure has to be maintained between the heat dissipating components and the envelope to decrease the thermal contact resistance.

2) The card, or printed circuit board, on which modules are attached has to be specially supported to maintain sufficient pressure to ensure heat transfer efficiency. This requires a card stiffener and flexible card supports to allow the card to move with the thermal expansion of the liquid. Without this special support mechanism, the circuit card would flex during thermal cycling, with possible damage to lands and component/card interfaces.

3) The liquid envelope restricts complete surface coverage of the component by the liquid.

What is needed is a liquid heat sink that retains the advantages of such heat sinks, but which avoids most, if not all, the problems of the prior art liquid heat sinks.

SUMMARY OF THE INVENTION

In accordance with the invention, a liquid heat sink is provided that employs natural convection of the liquid coolant to cool a printed circuit board on which are mounted a plurality of heat-generating components. In particular, the spacing between the heat-generating components and a cold plate used to cool the liquid must be such as to provide a Rayleigh number of at least about 1700 in the Rayleigh equation:

$$Ra = \frac{g\beta(T_2 - T_1)d^3}{v\alpha},$$

where g is the acceleration of gravity, $\beta$ is the volumetric coefficient of expansion of the liquid coolant, $T_1$ is the temperature of the cold plate, $T_2$ is the temperature of the component to be cooled, d is the spacing between the component and the cold plate, $v$ is the kinematic viscosity of the liquid coolant, and $\alpha$ is the thermal diffusivity of the liquid coolant.

The novel heat sink of the present invention allows complete immersion of the component in the liquid to provide maximum heat transfer, while at the same time providing a mounting/packaging scheme that allows full utilization of the desired heat transfer properties. The novel heat sink of the invention is particularly efficacious when implemented in the horizontal position.

BRIEF DESCRIPTION OF THE DRAWINGS

FIGS. 4A-B depict another embodiment of the invention for accommodating changes in coolant liquid volume as a function of thermal cycling, with FIG. 4A illustrating a perspective view and FIG. 4B a cross-sectional view, taken along the line 4B—4B.

DESCRIPTION OF THE INVENTION

Figure 1:
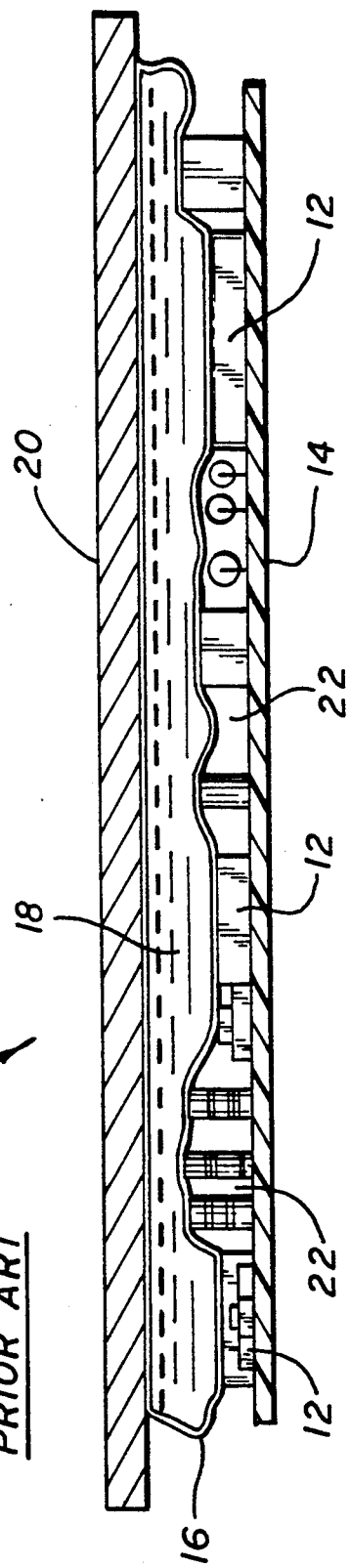
FIG. 1 is a cross-sectional view of a prior art liquid heat sink.

Turning now to the drawings wherein like numerals denote like elements, a prior art liquid heat sink 10 is depicted in FIG. 1. A plurality of electronic components or modules 12 are mounted on a printed circuit board, or card, 14. An envelope 16, containing a cooling liquid 18, serves to conduct heat generated within the modules 12 to a cold plate 20, where the heat is dissipated. It will be observed that there are areas, denoted 22, in which there is no contact by the envelope 16, and hence no heat sinking capability.

Figure 2:
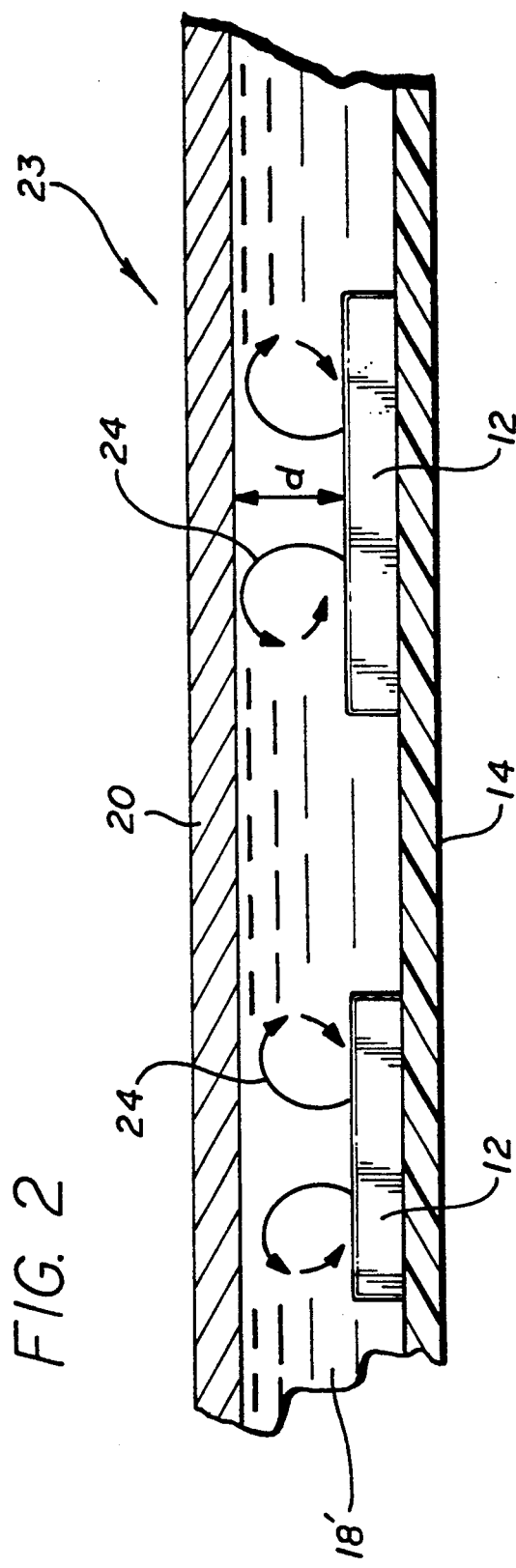
FIG. 2 is a cross-sectional view of an embodiment of the invention, in the horizontal position.

In accordance with the invention, liquid heat sink apparatus 23, shown in FIG. 2, allows complete immersion of the component(s) 12 in the liquid 18' to provide maximum heat transfer, while at the same time providing a mounting/packaging scheme that allows full utilization of the desired heat transfer properties.

The operating principle of the liquid heat sink of the invention is as follows:

Horizontal position (heat engine mode) for single sided card (depicted in FIG. 2):

If the Raleigh number (Ra) is below 1700, where $$Ra = \frac{g\beta(T_2 - T_1)d^3}{v\alpha},$$

then the fluid 18' remains at rest. In the above equation, g is the acceleration of gravity, $\beta$ is the volumetric co-efficient of expansion of the liquid coolant 18', $T_1$ is the temperature of the cold plate 20, $T_2$ is the temperature of the component 12 to be cooled, d is the spacing between the component and the cold plate, $v$ is the kinematic viscosity of the liquid coolant, and $\alpha$ is the thermal diffusivity of the liquid coolant. As can be seen from the foregoing, once a particular liquid coolant 18' is selected, the only variables are $T_2$ and d.

At a Rayleigh value above 1700, the fluid 18' comes to motion. The fluid naturally establishes hot rising regions and cold falling regions, with horizontal motion at top and bottom to maintain continuity as shown in FIG. 2 by arrows 24. The rising fluid loses its heat by thermal conduction when it gets near the cold plate 20 and can thus move downwards again.

Similarly, the cold downgoing fluid is warmed in the vicinity of the hot components 12 and can rise again. When the flow is established as a steady pattern, the continuous release of potential energy is balanced by viscous dissipation of mechanical energy. The potential energy is provided by the heating of the bottom and the cooling at the top. From a thermodynamic point of view, the system operates as a heat engine.

Since selection of a particular liquid coolant fixes a number of values in the Rayleigh equation, it is seen that whether the requisite cooling by convection currents will occur is solely dependent on the variables $T_2$ and d. In particular, the Rayleigh number is quite sensitive to the value of d, the spacing between the component 12 to be cooled and the cold plate 20.

To determine whether a chosen value of d provides the requisite value of Ra for a given system, the temperature of the component 12, $T_2$, is measured, and the value of Ra is calculated, based on the constants for the particular liquid coolant. The temperature of the cold plate 20, $T_1$, is at or near ambient, typically within a few degrees. If the value of Ra is less than 1700, then the value of d is adjusted and the measurement of $T_2$ taken again. Experience will allow the person skilled in the art to determine the appropriate value of d for a given system rather quickly, without undue experimentation.

Preferably, the combination of printed circuit board 14 and cold plate 20 is maintained in a horizontal or substantially horizontal position, in order to employ the teachings of the invention.

Overall, the liquid heat sink of the invention eliminates potential interface problems between modules and heat sink and more importantly, it will even out the temperature distribution on the card 14 due to the fluid motion. The external resistance can be significantly reduced by the increase in surface area. The heat sink of the present invention permits high packaging/power densities. I could lower the card cost by using non-encapsulated components on the card, by means of employing a liquid coolant that is inert to the components.

The liquid heat sink of the present invention also has the following advantages over the conventional forced liquid cooling: (1) the disclosed heat sink is passive and does not require a pump and duct for the circulation of the fluid; (2) the disclosed heat sink is simple and cost effective. As long as this does not pose any problem associated with corrosion and electrical shortage due to the direct contact of liquid 18' with electrical circuits, this has a promising future as a commercial product.

Examples of fluids suitably employed in the practice of the invention include the fluorocarbons, such as represented by the formula $C_nF_{2n-2}$. These liquids are chemically and electrically inert and can be used in direct contact with the electronic components. Examples include FC-72 and FC-77, both available from 3M Company under the trade designation FLUORINERT chemically inert, electrically safe liquids.

The liquid coolant is maintained in a sealed environment, provided by a gasket 26 which is placed around the perimeter of the electronic components 12 on the printed circuit board 14. (The gasket 26 is seen in FIGS. 3B and 4B.) Specifically, the gasket 26 provides sealing connection between the cold plate 20 and housing 28. Suitable fasteners (not shown) hold the printed circuit board 14 and the cooling plate 20 in appropriate sealed relationship with the gasket 26.

The gasket 26 comprises a compliant material that is inert to the liquid coolant 18'. An example of a suitable material is nitrile rubber, which can be used with FC-77 fluorocarbon.

The heat transfer rate through the layer is of interest in heat transfer practice. Below the critical Rayleigh number (Ra<1700), the fluid is at rest and the heat transfer is due solely to heat conduction. In this case, the heat transfer mechanism is not efficient because the liquid coolant 18' is not a good thermal conductor. Above the critical Rayleigh number, the cellular convection pattern enhances the heat flux, so that the heat transfer rate h is described by $$h \propto Ra^{\frac{1}{3}}$$

which is the empirical correlation for a layer of fluid between two horizontal plates.

One side of the printed circuit board 14 is provided with a connector by which the printed circuit board can communicate or interface with other boards or electronic devices. The connector area has to be hermetically sealed by, for example, epoxy to avoid any leakage. The connector and sealing thereof are further described below.

The liquid coolant 18' usually expands as it is heated. Hence, the package must be provided with a means for dealing with the thermal expansion of the liquid. For example, a rubber diaphragm 32 can be employed to allow the liquid to expand and contract without causing excessive pressure to build up in the package.

Figure 3A:
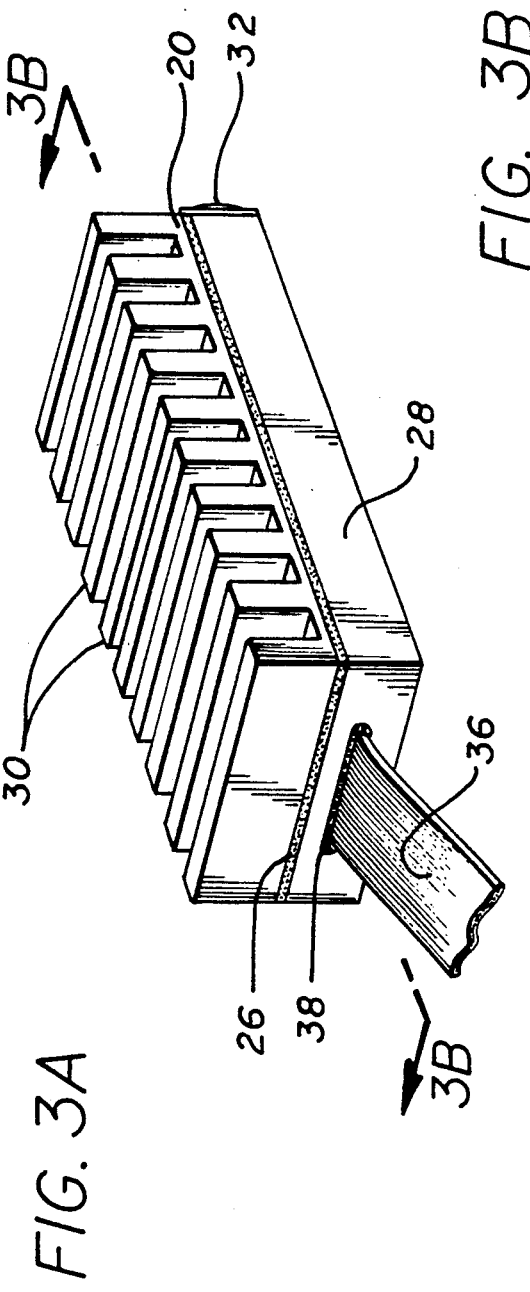
FIGS. 3A-B depict one embodiment of the invention for accommodating changes in coolant liquid volume as a function of thermal cycling, with FIG. 3A illustrating a perspective view and FIG. 3B illustrating a cross-sectional view, taken along the line 3B—3B.
Figure 3B:
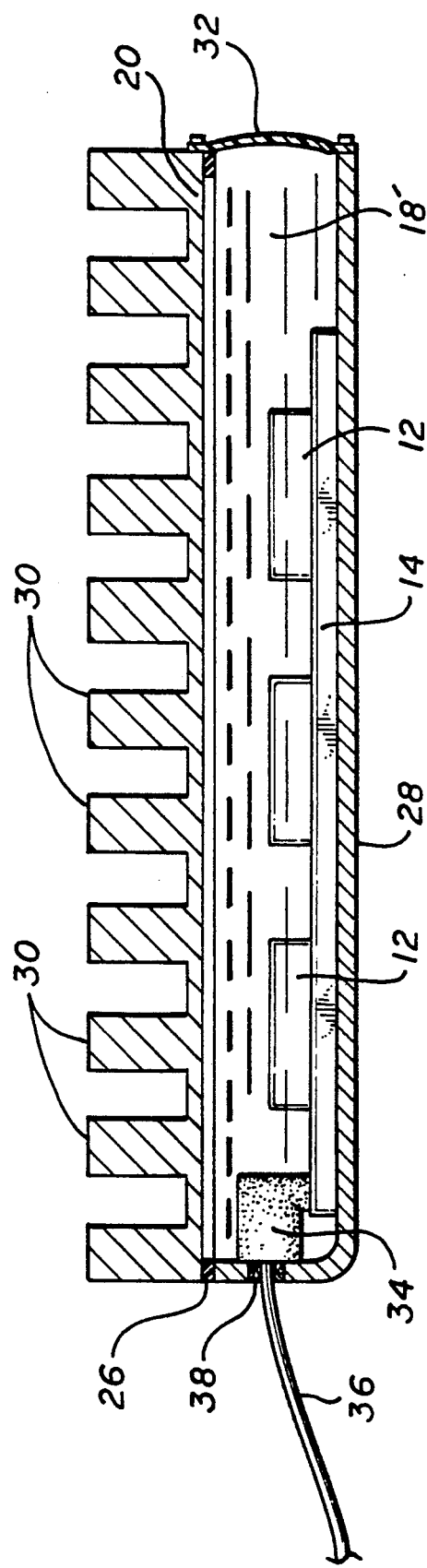

FIGS. 3A-B depict one embodiment of the present invention, in which the printed circuit board 14 and liquid coolant 18' are maintained in a sealed housing 28, to which the cold plate 20 is attached. The cold plate is shown with optional cooling fins 30.

In this embodiment, one or more flexible walls 32 are employed to accommodate the expansion of the liquid coolant 18'. The connector described above, designated 34, is shown at one end of the printed circuit board 14, with a cable 36 for communicating with external circuitry (not shown). The connector 34 is sealed with a sealant 38 against leakage of the liquid coolant 18'.

FIGS. 4A—B depict another embodiment of the present invention. Here, a sealed chamber 40 is provided by housing 42, which is in fluid communication with the liquid coolant 18'. The fluid level when cold is indicated at A, while the fluid level when hot is indicated at B, leaving an air gap at all times.

Other schemes for accommodating the thermal expansion of the liquid coolant 18' may also be envisioned.

INDUSTRIAL APPLICABILITY

The liquid heat sink of the invention is expected to find use in a variety of applications where cooling of electronic components is critical.

Thus, the present invention has been described herein with reference to a particular embodiment for a particular application. Those having ordinary skill in the ar and access to the present teachings will recognize additional modifications, applications, and embodiments within the scope thereof.

It is therefore intended by the appended claims to cover any and all such modifications, applications, and embodiments within the scope of the present invention.

Accordingly,
What is claimed is:
1. Liquid heat sink apparatus for cooling electronic components mounted on a printed circuit board, comprising:
   (a) a cold plate mounted opposite said electronic components and substantially parallel to said printed circuit board;

(b) means for containing a liquid coolant between said printed circuit board and said cold plate;

(c) said liquid coolant contained between said printed circuit board and said cold plate and in thermal contact with said printed circuit board said electronic components mounted thereon, and said cold plate, wherein said cold plate is maintained a distance d from said electronic components sufficient to provide a Rayleigh number of at least 1700 in the equation $$Ra = \frac{g\beta(T_2 - T_1)d^3}{\nu\alpha},$$

where g is the acceleration of gravity, $\beta$ is the volumetric coefficient of expansion of said liquid coolant, $T_1$ is the temperature of said cold plate, $T_2$ is the temperature of the component to be cooled, $\nu$ is the kinematic viscosity of said liquid coolant, and $\alpha$ is the thermal diffusivity of said liquid coolant;

(d) means for maintaining said cold plate said distance d from said printed circuit board, comprising a sealed housing supporting said cold plate and surrounding said printed circuit board and attached thereto to thereby provide a sealed space for maintaining said liquid coolant herein; and (e) said sealed housing including means for accommodating expansion of said liquid coolant during thermal cycling.

2. The liquid heat sink apparatus of claim 1 wherein said liquid coolant i selected from the group of fluorocarbon liquids having the formal $C_nF_{2n-2}$.

3. The liquid heat sink apparatus of claim 1 wherein said printed circuit board is maintained in a substantially horizontal position.

4. The liquid heat sink apparatus of claim 1 wherein id cold plate is attached to said printed circuit board with a gasket to thereby provide said sealed space for maintaining said liquid coolant therein.

5. The liquid heat sink apparatus of claim 4 further including at least one connector for interfacing said printed circuit board to other electronic components, said connector passing through a portion of said sealed housing and sealed thereto.

6. The liquid heat sink apparatus of claim 1 wherein said means for accommodating expansion comprises at least one flexible wall of said sealed housing.

7. The liquid heat sink apparatus of claim 1 wherein said means or accommodating expansion comprises a sealed chamber fluidically communicating with said liquid coolant and having an air space therein.

* * * * *